(12) United States Patent
Wasshuber

(10) Patent No.: US 6,432,781 B2
(45) Date of Patent: Aug. 13, 2002

(54) INVERTED MOSFET PROCESS

(75) Inventor: Christoph Wasshuber, Parker, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/880,432

(22) Filed: Jun. 13, 2001

Related U.S. Application Data

(60) Provisional application No. 60/212,607, filed on Jun. 19, 2000.

(51) Int. Cl.$^7$ .............................................. H01L 21/336
(52) U.S. Cl. ........................ 438/289; 438/290; 438/291
(58) Field of Search ................................ 438/176, 183, 438/217, 289, 290, 301, 303, 305, 291

(56) References Cited

U.S. PATENT DOCUMENTS

| | | | | |
|---|---|---|---|---|
| 5,834,355 A | * | 11/1998 | Doyle | 438/305 |
| 5,856,225 A | * | 1/1999 | Lee et al. | 438/291 |
| 5,985,726 A | * | 11/1999 | Yu et al. | 438/301 |
| 6,063,677 A | * | 5/2000 | Rodder et al. | 438/300 |
| 6,225,173 B1 | * | 5/2001 | Yu | 438/301 |

* cited by examiner

Primary Examiner—John F. Niebling
Assistant Examiner—Walter L. Lindsey, Jr.
(74) Attorney, Agent, or Firm—Peter K. McLarty; W. James Brady, III; Frederick J. Telecky, Jr.

(57) ABSTRACT

An inverted MOSFET process. A replacement gate (100) and removable sidewalls (80) allow the formation of spot implant regions (120) and (130) to form the pocket region (120) and the drain and source regions (130) of the MOSFET. The replacement gate (100) has a flared profile for reduced resistance.

9 Claims, 3 Drawing Sheets

INVERTED MOSFET PROCESS

This application claims priority under 35 USC §119(e)(1) of provisional application Serial No. 60/212,607, filed Jun. 19, 2000.

FIELD OF THE INVENTION

The invention is generally related to the field of MOSFET transistor fabrication and more specifically to a novel process for fabricating a high performance MOSFET.

BACKGROUND OF THE INVENTION

As MOSFET technology continues to scale further into the sub-micron region, it becomes increasingly difficult to keep sufficiently low gate sheet resistance, low junction capacitance, and low junction depth of source/drain extensions under the gate. As transistors are scaled into the deep sub-micron region, the polysilicon gate linewidths become narrower and narrower. This increases the gate sheet resistance. Achieving low gate sheet resistance becomes difficult even when silicided polysilicon is used. In addition it becomes increasingly difficult to form the sub-micron polysilicon lines using currently available optical photolithographic techniques. For polysilicon linewidths in the sub-micron regime optical proximity correction is used during polysilicon gate formation. Optical proximity correction adds cost and complexity to the MOSFET fabrication process.

The source/drain junction regions and source/drain extensions must also become shallower to avoid undesired short-channel effects and roll-off of the threshold voltage at short channel lengths. However, in the deep sub-micron region, it is difficult to achieve shallower doping profiles because in conventional processes the source and drain extension implants are subjected to the high temperature source/drain implant anneal which causes diffusion of the implanted species. Therefore, there is a need for a MOSFET transistor structure that can be scaled into the sub-micron region while maintaining sufficiently low gate sheet resistance, shallow junction depth, and low junction capacitance.

One of the most challenging issues facing the fabrication of sub-micron transistors is forming shallow source/drain extensions under the sidewall spacer. This problem is especially severe for the replacement gate transistor design if inner sidewalls spacers are added to decrease the linewidth of the replacement gate which is formed in the slot in an insulator left by removal of the disposable gate. There are a number of prior art inventions in which a gate is formed in a slot in an insulator by a means other than the removal of the disposable gate. A common problem with these inventions is how to place a shallow drain extender underneath sidewall spacers deposited in the slot. In one prior art example, after nitride spacers are formed on the inner walls of the slot, thermal oxide is grown in the space between the sidewalls. Next, the nitride spacers are removed and the shallow source/drain junction extenders are implanted into the spaces where the nitride spacers have been removed with the thermal oxide in the center blocking these implants. Next, the nitride spacers are reformed, the center thermal oxide removed, and replaced with a thin gate oxide. Finally, the slot is filled with the gate material. This is a very complicated process which is not very manufacturable.

SUMMARY OF THE INVENTION

The instant invention is an inverted MOSFET process. This process comprises the steps of: providing a semiconductor substrate containing isolation structures; forming a gate-like structure over said semiconductor substrate; forming transistor source and drain regions in said semiconductor substrate adjacent to said gate-like structure; forming a first dielectric film over said semiconductor substrate wherein said first dielectric film is adjacent to said gate-like structure; removing said gate-like structure; forming removable sidewall structures adjacent to said first dielectric film in a region from which said gate-like structure was removed; forming a gate dielectric on said semiconductor substrate between said removable sidewall structures; forming a replacement gate adjacent to said removable sidewall structures over said gate dielectric; removing said removable sidewall structures; and forming pocket regions and drain/source extension regions in said semiconductor substrate adjacent to said replacement gate.

The inverted MOSFET process offers a number of advantages over conventional MOSFET processes. The inverted process results in spot implants, a flared gate shape, low temperature anneals for the drain and source extension implants, a larger minimum feature (i.e. etched gate size which allows less optical proximity correction during lithography). These characteristics results in higher drive currents form the transistors. This and other advantages will be apparent to those of ordinary skill in the art having reference to the specification in conjunction with the drawings.

Figure 1A:
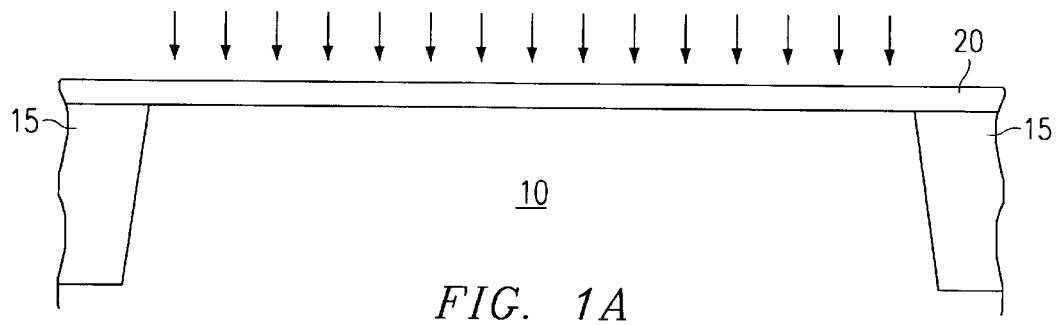
FIGS. 1A–1G are cross-sectional views illustrating an embodiment of the instant invention.
Figure 1B:
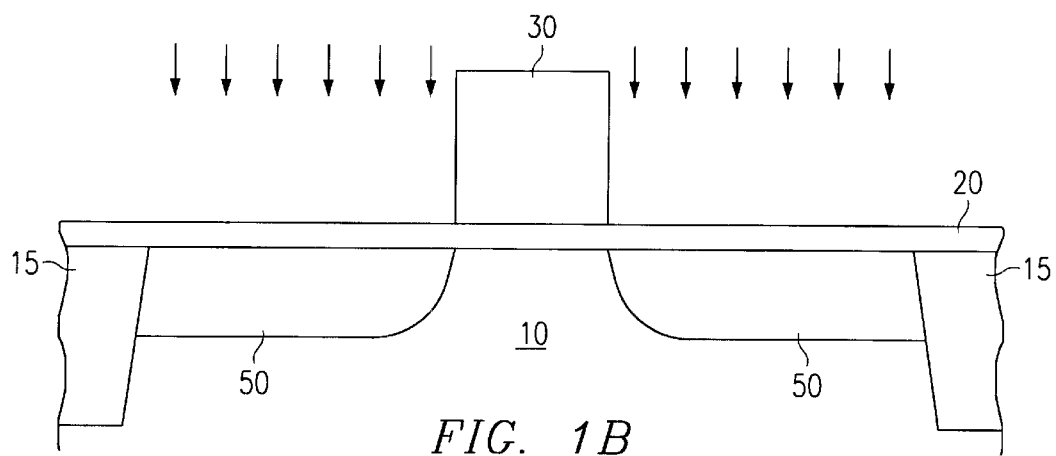

Common reference numerals are used throughout the figures to represent like or similar features. The figures are not drawn to scale and are merely provided for illustrative purposes.

DETAILED DESCRIPTION OF THE INVENTION

While the following description of the instant invention revolves around FIGS. 1A–1G, the instant invention can be utilized in any semiconductor device structure. The methodology of the instant invention provides a solution to the fabrication of a high performance MOSFET.

Figure 1C:
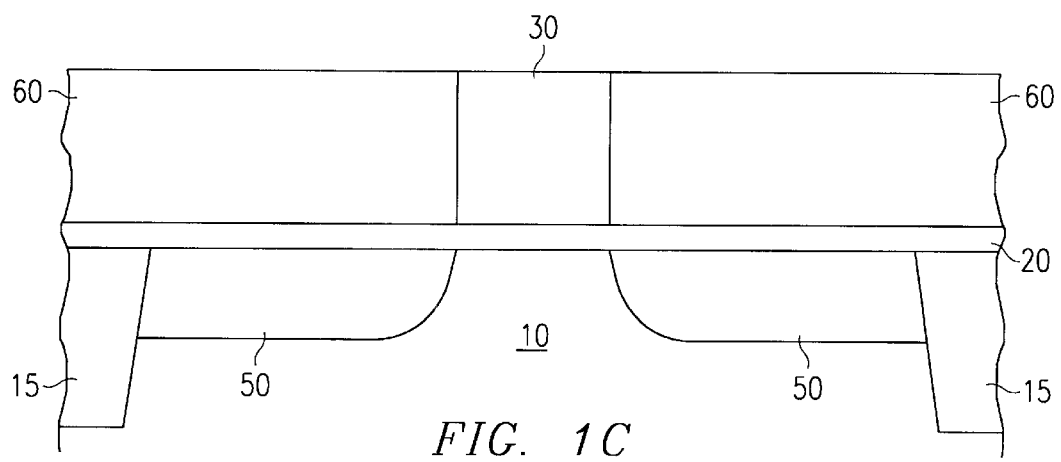
Figure 2:
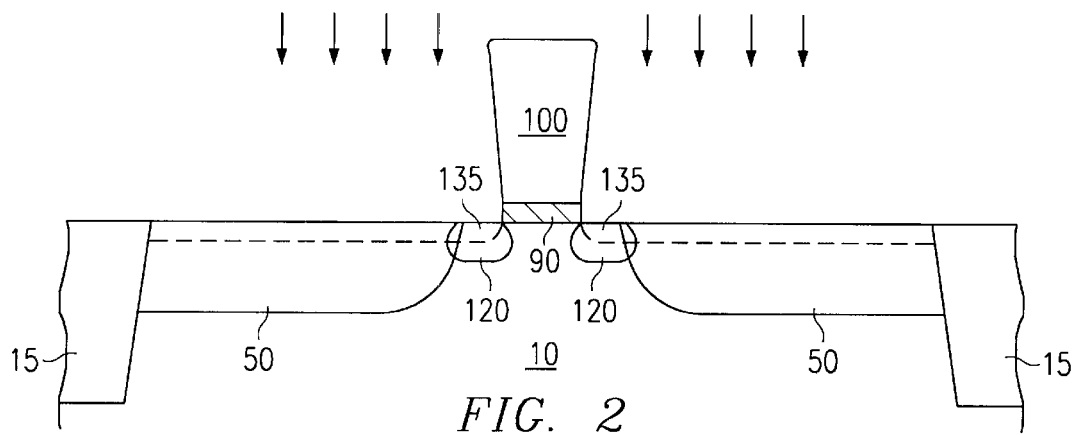
FIG. 2 is a cross-sectional view showing an embodiment of the instant invention.
Figure 3:
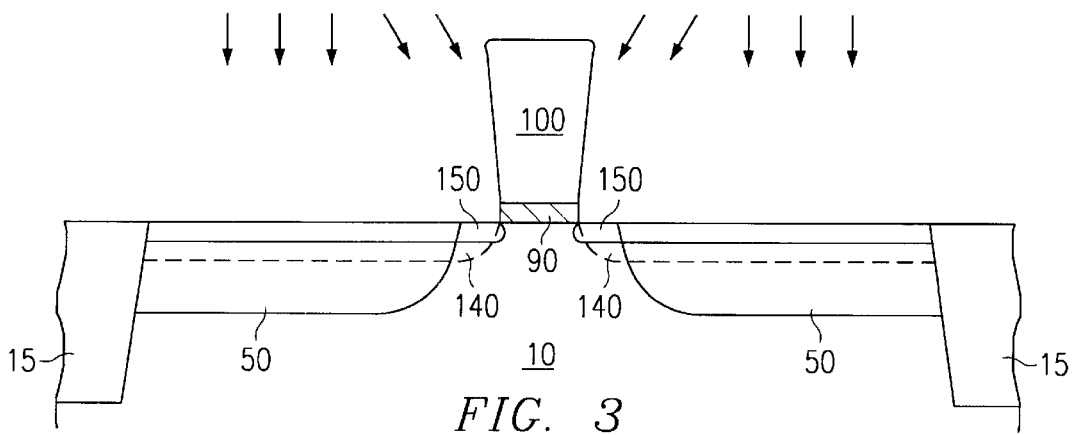
FIG. 3 is a cross-sectional view showing a further embodiment of the instant invention.

The following description of the instant invention will be related to FIGS. 1A–1G. Additional embodiments of the instant invention are shown in FIGS. 2 and 3. Referring to FIG. 1A, isolation structures 15 are formed in a semiconductor substrate 10. In an embodiment of the instant invention, the isolation structures are shallow trench isolation (STI) formed using standard processing methods. Following the formation of the isolation structures 15, a number of ion implantation processes can be performed. These implantation processes include the well implants, the channel stop implants, and the punch through implants. These implantation processes are necessary to form the required doping concentrations in the various wells for proper transistor operation. A dielectric film 20 is then formed on the surface of the substrate 10. This dielectric film 20 may be comprised of an oxide, thermally grown $SiO_2$, a nitride, an oxynitride, or any combination thereof. In some applications, the dielectric layer 20 can be eliminated. A blanket layer of silicon containing material is formed on the dielectric layer 20 and patterned and etched to form the removable gate-like structure 30 shown in FIG. 1B. Preferably, this silicon-containing material is comprised of polycrystalline silicon("poly" or "polysilicon"), but it may be comprised of epitaxial silicon or any other semiconducting material. It should be noted that any material which can be selectively removed as later described can be used to form the removable gate-like structure 30. In an embodiment in which the gate-like structure 30 is formed from polysilicon, a layer of photoresist is formed and patterned on the blanket polysilicon film to define the gate-like structure. Next an etch process is used to remove portions of the blanket film leaving a polysilicon gate-like structure 30 shown in FIG. 1B. This polysilicon gate etch process may comprise a dry plasma process. Following the formation of the gate-like structure 30, the source and drain regions of the transistor are formed using ion implantation followed by a high temperature annealing process to electrically activate the implanted species. After the formation of the source and drain regions 50, a dielectric film 60 is formed on the structure as shown in FIG. 1C. This dielectric film 60 may be comprised of an oxide, a nitride, an oxynitride, or any combination thereof. The formation of the dielectric film shown in FIG. 1C may also involve the use of chemical mechanical polishing (CMP) to produce a film 60 which is planar with the top surface of the gate-like structure 30.

Figure 1D:
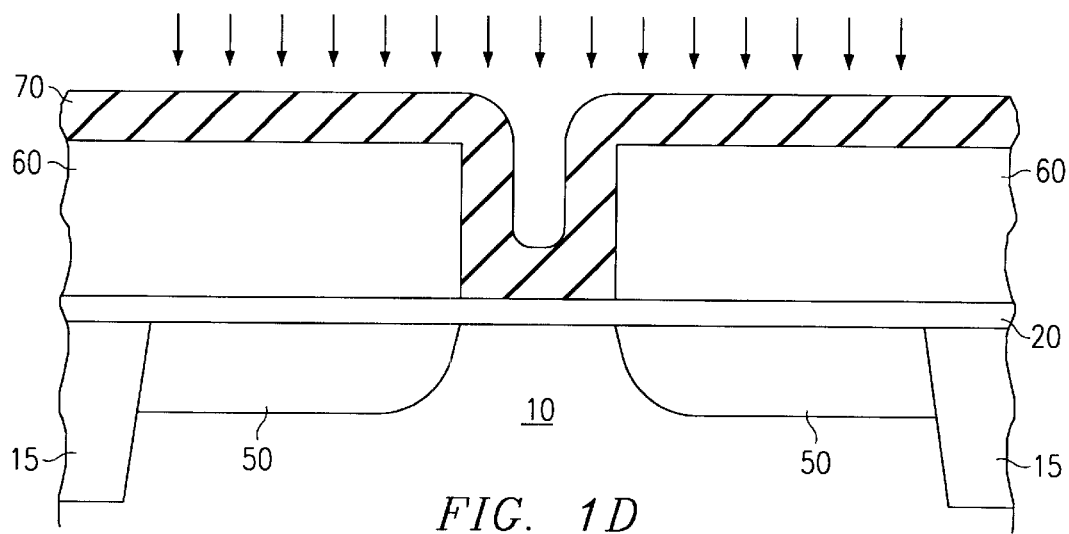
Figure 1E:
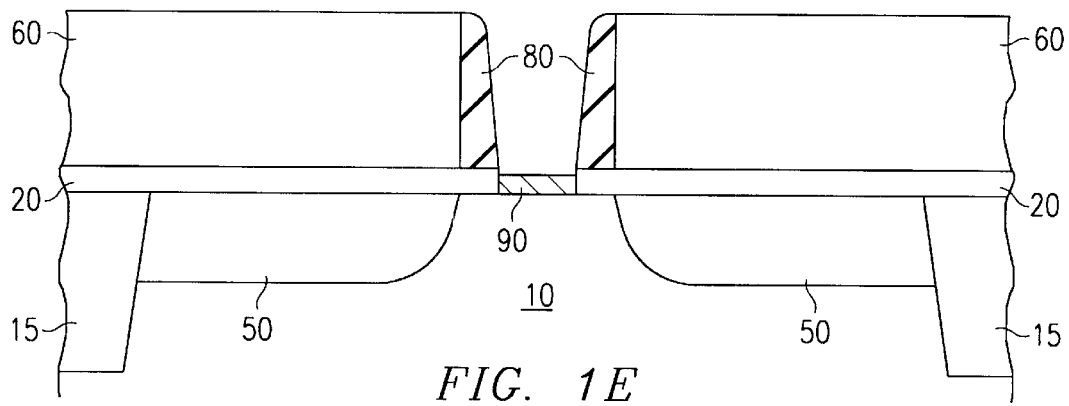

Following the formation of the dielectric film 60, the gate-like structure is removed as illustrated in FIG. 1D. For the case where the gate-like structure 30 is polysilicon and the dielectric film 60 is silicon oxide, a wet chlorine etch can be used to selectively remove the gate-like structure. Following the removal of the gate-like structure, transistor threshold voltage implants can be performed. Following the threshold voltage implants, a dielectric film 70 is formed as shown in FIG. 1D. This dielectric film 70 may be comprised of silicon oxide, silicon nitride, silicon oxynitride, alternating layers or stacks of these materials or any suitable conformal film. The dielectric film 70 is then anisotropically etched to form the removable sidewall structures 80 shown in FIG. 1E. The exposed portion of the dielectric film 20 is then removed and a gate dielectric film 90 is formed. This gate dielectric film 90 may be comprised of an oxide, thermally grown SiO2, a nitride, an oxynitride, or any combination silicate thereof. The transistor threshold voltage implants described earlier can also be performed after the removal of the exposed dielectric film 20 and before or after the formation of the gate dielectric film 90.

Figure 1F:
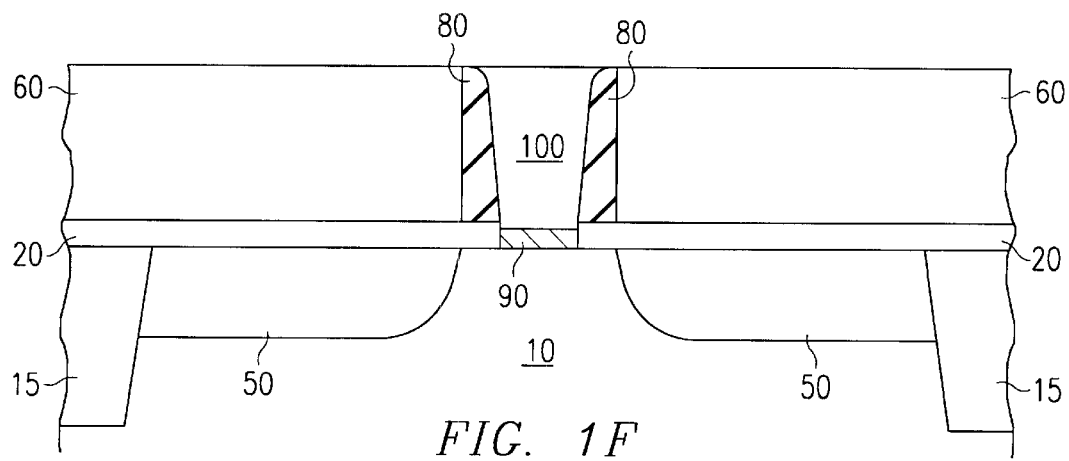
Figure 1G:
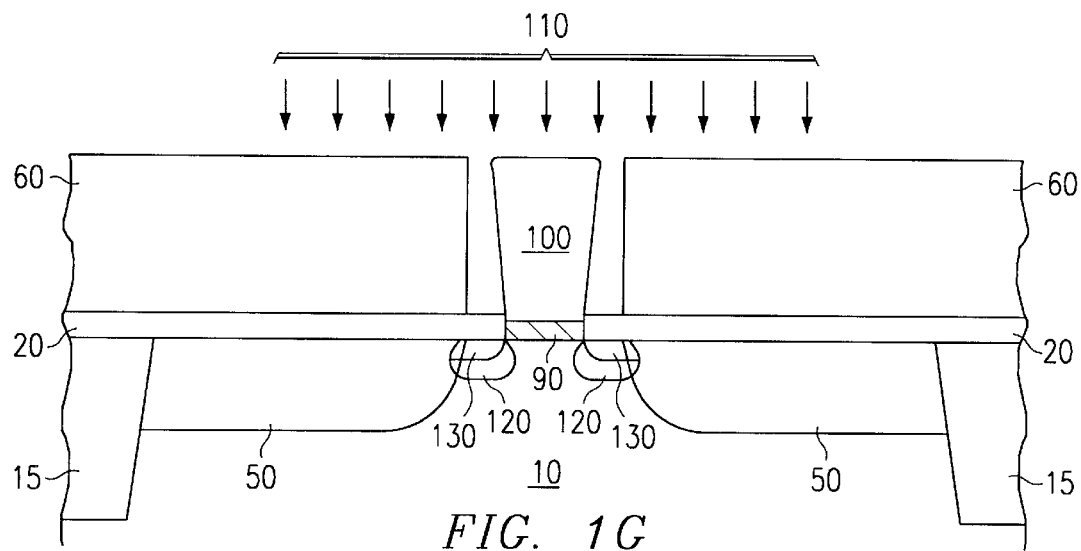

Following the formation of the gate dielectric film 90 (and the transistor threshold voltage implants if performed after the formation of the gate dielectric film), a replacement gate 100 is formed as shown in FIG. 1F. This replacement gate may comprise polysilicon, metal, silicon metal alloys, conductive silicon containing material, or other suitable conductive material. As shown in FIG. 1G, the formation of the replacement gate 100 is followed by the removal of the removable sidewall structures 80 and pocket and drain and source extension implants 110. As shown in FIG. 1G, the top of the replacement gate 100 is wider than the bottom of the gate which is in contact with the gate dielectric 90. This flared replacement gate 100 has reduced resistance when compared to a conventional gate i.e. parallel sides) of similar transistor gate length. Here the transistor gate length is defined as the width of the gate structure that is in contact with the gate dielectric. In some cases these drain and source extension implants are known as lightly doped drain (LDD) or moderately doped drain (MDD) implants. As illustrated in FIG. 1G, pocket regions 120 are formed by a pocket implant and drain/source extension regions 130 are formed using a source and drain extension implant. The dielectric film 60 prevents the pocket and the drain and source extension implants from entering and counter doping the source drain regions. In addition, because the high temperature drain and source anneal has already been performed, the pocket and extension implants will not be subjected to a high temperature anneal as in conventional CMOS processing. This leads to more abrupt drain and source junctions which in turn leads to improved transistor performance. Following the formation of the pocket regions 120 and the drain/source extension regions 130, the dielectric films 60 and 20 are removed and the transistor completed using standard CMOS processing.

Shown in FIG. 2 is an embodiment of the instant invention. Here, after the formation of the pocket regions 120, the dielectric film 60 is removed before performing the source and drain extension implants to form the drain/source extension regions 135. In a further embodiment, the dielectric film 20 can also be removed before performing the source and drain extension implants. In this case the overlap of the drain/source extension regions 135 and the source and drain regions 50 tends to provide improved electrical continuity between the regions. Following the formation of regions 135, the transistor can be completed using standard CMOS processing methods. Shown in FIG. 3 is a further embodiment of the instant invention. In this embodiment, the dielectric film 60 is removed before the pocket implant is used to form the pocket regions 150 and the source and drain extension implant is used to form the drain/source extension regions 140. The dielectric film 20 can also be removed before performing the implants. The removal of the dielectric film 60 before the pocket implant allows a more acute implant angle resulting in a greater portion of the pocket regions 150 extending under the gate dielectric 90. This results in more effective threshold voltage control but introduces counter doping effects.

While this invention has been described with reference to illustrative embodiments, this description is not intended to be construed in a limiting sense. Various modifications and combinations of the illustrative embodiments, as well as other embodiments of the invention will be apparent to persons skilled in the art upon reference to the description. It is therefore intended that the appended claims encompass any such modifications or embodiments.

I claim:
1. A method for forming an inverted MOSFET, comprising:
   providing a semiconductor substrate containing isolation structures;
   forming a gate-like structure over said semiconductor substrate;
   forming transistor source and drain regions in said semiconductor substrate adjacent to said gate-like structure;
   forming a first dielectric film over said semiconductor substrate wherein said first dielectric film is adjacent to said gate-like structure;
   removing said gate-like structure;
   forming removable sidewall structures adjacent to said first dielectric film in a region from which said gate-like structure was removed;
   performing threshold voltage ion implantation in semiconductor substrate between said removable sidewall structures;

forming a gate dielectric on said semiconductor substrate between said removable sidewall structures;

forming a replacement gate adjacent to said removable sidewall structures over said gate dielectric;

removing said removable sidewall structures; and forming pocket regions and drain/source extension regions in said semiconductor substrate adjacent to said replacement gate.

2. The method of claim 1 wherein said isolation structures are shallow trench isolation.

3. The method of claim 1 wherein said replacement gate is flared.

4. A method for forming an inverted MOSFET, comprising:

providing a semiconductor substrate containing isolation structures;

forming a gate-like structure over said semiconductor substrate;

forming transistor source and drain regions in said semiconductor substrate adjacent to said gate-like structure;

forming a first dielectric film over said semiconductor substrate wherein said first dielectric film is adjacent to said gate-like structure;

removing said gate-like structure;

forming a plurality of removable sidewall structures adjacent to said first dielectric film in a region from which said gate-like structure was removed;

performing threshold voltage ion implantation in semiconductor substrate between said removable sidewall structures;

forming a gate dielectric on said semiconductor substrate between said removable sidewall structures;

forming a replacement gate adjacent to said removable sidewall structures over said gate dielectric;

removing said removable sidewall structures;

forming pocket regions in said semiconductor substrate adjacent to said replacement gate;

removing said first dielectric film; and forming drain/source extension regions in said semiconductor substrate adjacent to said replacement gate.

5. The method of claim 4 wherein said isolation structures are shallow trench isolation.

6. The method of claim 4 wherein said replacement gate is flared.

7. A method for forming an inverted MOSFET, comprising:

providing a semiconductor substrate containing isolation structures;

forming a gate-like structure over said semiconductor substrate;

forming transistor source and drain regions in said semiconductor substrate adjacent to said gate-like structure;

forming a first dielectric film over said semiconductor substrate wherein said first dielectric film is adjacent to said gate-like structure;

removing said gate-like structure;

forming a plurality of removable sidewall structures adjacent to said first dielectric film in a region from which said gate-like structure was removed;

performing threshold voltage ion implantation in semiconductor substrate between said removable sidewall structures;

forming a gate dielectric on said semiconductor substrate between said removable sidewall structures;

forming a replacement gate adjacent to said removable sidewall structures over said gate dielectric;

removing said removable sidewall structures;

removing said first dielectric film;

forming pocket regions in said semiconductor substrate adjacent to said replacement gate; and forming drain/source extension regions in said semiconductor substrate adjacent to said replacement gate.

8. The method of claim 7 wherein said isolation structures are shallow trench isolation.

9. The method of claim 7 wherein said replacement gate is flared.

* * * * *